United States Patent
Kang et al.

(10) Patent No.: US 9,972,490 B2
(45) Date of Patent: May 15, 2018

(54) PLASMA STABILIZATION METHOD AND DEPOSITION METHOD USING THE SAME

(71) Applicant: ASM IP Holding B.V.

(72) Inventors: Dong Seok Kang, Cheonan-si (KR); Yo Chul Jang, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 0 days. days.

(21) Appl. No.: 15/451,273

(22) Filed: Mar. 6, 2017

(65) Prior Publication Data

US 2017/0263442 A1    Sep. 14, 2017

(30) Foreign Application Priority Data

Mar. 10, 2016    (KR) .................. 10-2016-0029105

(51) Int. Cl.
| | |
|---|---|
| H01L 21/44 | (2006.01) |
| H01L 21/02 | (2006.01) |
| C23C 16/50 | (2006.01) |
| C23C 16/54 | (2006.01) |
| H01L 21/67 | (2006.01) |

(52) U.S. Cl.
CPC .......... *H01L 21/0262* (2013.01); *C23C 16/50* (2013.01); *C23C 16/54* (2013.01); *H01L 21/02661* (2013.01); *H01L 21/67196* (2013.01); *H01L 21/67201* (2013.01)

(58) Field of Classification Search
CPC ........... H01L 21/0262; H01L 21/02661; H01L 21/67196; H01L 21/67201; C23C 16/50; C23C 16/54
USPC ........................................................ 438/680
See application file for complete search history.

(56) References Cited

U.S. PATENT DOCUMENTS

| | | | |
|---|---|---|---|
| 6,086,962 A * | 7/2000 | Mahoney ................ C23C 16/26 |
| | | | 427/249.7 |
| 2003/0219546 A1 | 11/2003 | Andideh et al. | |
| 2003/0234450 A1* | 12/2003 | Grill ..................... C23C 16/401 |
| | | | 257/759 |
| 2004/0038525 A1* | 2/2004 | Meng ................. C23C 16/45542 |
| | | | 438/656 |
| 2005/0257747 A1* | 11/2005 | Wakabayashi ...... C23C 16/4581 |
| | | | 118/728 |
| 2006/0046412 A1* | 3/2006 | Nguyen .................. C23C 16/44 |
| | | | 438/337 |
| 2006/0269693 A1* | 11/2006 | Balseanu .............. C23C 16/345 |
| | | | 427/569 |
| 2007/0202253 A1* | 8/2007 | Ong .................... C23C 16/0209 |
| | | | 427/248.1 |

(Continued)

OTHER PUBLICATIONS

Office Action dated Jan. 19, 2018 in related Taiwanese Application No. 106107502.

*Primary Examiner* — Caleb Henry
(74) *Attorney, Agent, or Firm* — Knobbe Martens Olson & Bear LLP (57) ABSTRACT

A plasma stabilization method and a deposition method using the same are disclosed. The plasma stabilization method includes (a) supplying a source gas and (b) supplying a purge gas. The method may also include (c) supplying a reactive gas and (d) supplying plasma. The purge gas and the reactive gas are continuously supplied into a reactor during (a) through (d), and the plasma stabilization method is performed in a state where no substrate exists in the reactor.

20 Claims, 10 Drawing Sheets

(56) References Cited

U.S. PATENT DOCUMENTS

| | | | |
|---|---|---|---|
| 2008/0020591 A1* | 1/2008 | Balseanu | C23C 16/345 |
| | | | 438/761 |
| 2010/0285237 A1* | 11/2010 | Ditizio | C23C 16/34 |
| | | | 427/569 |
| 2011/0079507 A1* | 4/2011 | Kaji | C23C 14/0641 |
| | | | 204/192.1 |
| 2012/0211351 A1* | 8/2012 | Tomyo | B82Y 10/00 |
| | | | 204/192.1 |
| 2014/0273531 A1 | 9/2014 | Niskanen et al. | |
| 2015/0136585 A1* | 5/2015 | Busch | H01J 37/3417 |
| | | | 204/192.13 |
| 2016/0329206 A1* | 11/2016 | Kumar | H01L 21/022 |

* cited by examiner

PLASMA STABILIZATION METHOD AND DEPOSITION METHOD USING THE SAME

CROSS-REFERENCE TO RELATED APPLICATION

This application claims the benefit of Korean Patent Application No. 10-2016-0029105, filed on Mar. 10, 2016, in the Korean Intellectual Property Office, the disclosure of which is incorporated herein in its entirety by reference.

BACKGROUND

1. Field

One or more embodiments relate to a plasma stabilization method and a deposition method using the same, and more particularly, to a plasma stabilization method of stably forming plasma in a reactive space and a deposition method using the plasma stabilization method.

2. Description of the Related Art

Recently, requirements for depositing ultra-thin films on silicon substrates have become increasingly stringent as line widths of semiconductor circuits have decreased to about 20 nm. In particular, research and development related to low-temperature deposition processes have been actively conducted. To this end, plasma enhanced atomic layer deposition (PEALD) processes in which ultra-thin films may be deposited at a low temperature have been developed. Since plasma in the PEALD processes activates a reactive gas and accelerates a reaction with a source gas, thin films may be formed at a low temperature.

SUMMARY

One or more embodiments include a method of stably forming plasma on a first substrate in a plasma process.

One or more embodiments include a method for solving a problem that after an idle time of equipment during which a substrate deposition process is not performed, for example, because in-situ cleaning is to be performed or a lot with substrates is to be changed (a lot here means a unit to carry substrates. One lot is usually comprised of 25 substrates), when a first substrate of a new lot is processed in a reactor, plasma is unstable and thus a thin film is abnormally deposited at the start of a process.

Additional aspects will be set forth in part in the description which follows and, in part, will be apparent from the description, or may be learned by practice of the presented embodiments.

According to one or more embodiments, a plasma stabilization method includes steps of: (a) supplying a source gas; (b) supplying a purge gas; (c) supplying a reactive gas; and (d) supplying plasma, wherein the purge gas and the reactive gas are continuously supplied into a reactor during steps (a) through (d), and the plasma stabilization method is performed in a state where no substrate exists in the reactor.

When steps (a) through (d) are referred to as one cycle, a plurality of cycles may be performed and the level of power of the plasma supplied during each cycle may be different from one another.

The levels of plasma power supplied during each cycle may increase sequentially in a range from about 10% to about 100% of a level of power of plasma supplied during a film deposition process.

The levels of plasma power may increase stepwise.

The plurality of cycles may include a pre-ignition cycle, a mid-ignition cycle, or a post-ignition cycle.

The levels of plasma power supplied during the pre-ignition cycle, the mid-ignition cycle, and the post-ignition cycle may be respectively ⅓, ½, and 1 time the level of plasma power supplied during the film deposition process.

Each of the pre-ignition cycle, the mid-ignition cycle, and the post-ignition cycle may be repeatedly performed three to five times.

When steps (a) through (d) are referred to as one cycle, a plurality of cycles may be performed and levels of plasma power supplied during the plurality of cycles may be the same and may be less than a level of plasma power supplied during a film deposition process.

Flow rates of the source gas, the purge gas, and the reactive gas may be the same as flow rates of a source gas, a purge gas, and a reactive gas supplied during a film deposition process.

A thin film may be formed on an inner wall of the reactor from steps (a) through (d).

The reactive gas and the purge gas may be the same type of reactive purge gas, wherein the reactive purge gas does not react with the source gas when the reactive purge gas is not activated by plasma and reacts with the source gas when the reactive purge gas is activated by plasma.

According to one or more embodiments, a deposition method includes: performing the plasma stabilization method; loading a substrate into the reactor; and performing deposition on the substrate.

According to one or more embodiments, a plasma stabilization method includes: a first step of supplying a purge gas, a reactive gas, and a source gas; a second step of stopping the supplying of the source gas, after the first step; a third step of applying plasma, after the second step; a fourth step of stopping the applying of the plasma, after the third step; and a fifth step of loading a substrate into a reactor and performing deposition on the substrate, after the fourth step.

The purge gas and the reactive gas may be supplied during the second step and the third step, and during the fourth step and the fifth step.

According to one or more embodiments, a deposition method includes: a first deposition step performed on a plurality of first set of substrates; a second deposition step performed on a plurality of second set of substrates, wherein a plasma stabilization step is performed between the first deposition step and the second deposition step, wherein a purge gas and a reactive gas are supplied during the plasma stabilization step, and supplying of a source gas and supplying of plasma are alternately performed.

The plasma stabilization step may be performed during at least one period from among a first period during which a substrate is transferred from a carrier to a transfer device, a second period during which the substrate is transferred from the transfer device to a load-lock device, a third period during which the substrate is transferred from the load-lock device to a transfer chamber, and a fourth period during which the substrate is transferred from the transfer chamber to a reaction chamber.

The plasma stabilization step may be performed during an idle time between deposition on a last substrate from among the plurality of first set of substrates and deposition on a first substrate from among the plurality of second set of substrates.

The plurality of first set of substrates may be included in a first lot, and the plurality of second set of substrates may be included in a second lot that is different from the first lot.

The plasma stabilization step may be performed after in-situ cleaning of a reaction chamber is performed.

At least one of the first deposition step and the second deposition step may include: supplying a first gas; removing the first gas that remains by using a purge gas; supplying a second gas and plasma; and removing the second gas that remains by using the purge gas, wherein the first gas includes the source gas supplied during the plasma stabilization step, and the second gas includes the reactive gas supplied during the plasma stabilization step.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

The present disclosure will now be described more fully with reference to the accompanying drawings, in which embodiments of the present disclosure are shown.

The present disclosure now will be described more fully hereinafter with reference to the accompanying drawings, in which elements of the present disclosure are shown. The present disclosure may, however, be embodied in many different forms and should not be construed as limited to the embodiments set forth herein. Rather, these embodiments are provided so that this disclosure will be thorough and complete, and will fully convey the scope of the present disclosure to one of ordinary skill in the art.

The terminology used herein is for the purpose of describing embodiments only and is not intended to be limiting of embodiments of the present disclosure. As used herein, the singular forms "a", "an", and "the" are intended to include the plural forms as well, unless the context clearly indicates otherwise. It will be further understood that the terms "comprises", "comprising", "includes", and/or "including", when used herein, specify the presence of stated features, integers, steps, operations, elements, components, and/or groups, but do not preclude the presence or addition of one or more other features, integers, steps, operations, elements, components, and/or groups thereof. As used here, the term "and/or" includes any and all combinations of one or more of the associated listed items.

It will be understood that although the terms "first", "second", etc. may be used herein to describe various members, regions, layers, and/or portions, these members, regions, layers, and/or portions should not be limited by these terms. The terms do not refer to a specific order, a vertical relationship, or a preference, and are only used to distinguish one member, region, or portion from another member, region, or portion. Accordingly, a first member, region, or portion which will be described below may refer to a second member, region, or portion without departing from the teaching of the present disclosure.

The present disclosure will now be described more fully with reference to the accompanying drawings, in which embodiments of the present disclosure are shown. In the drawings, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing.

Expressions such as "at least one of" when preceding a list of elements, modify the entire list of elements and do not modify the individual elements of the list.

Figure 1:
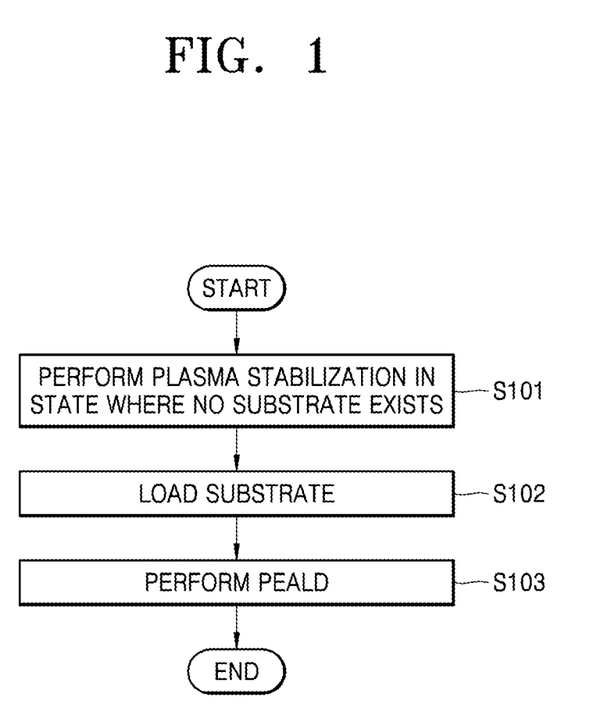
FIG. 1 is a flowchart of a plasma stabilization method and a deposition method using the plasma stabilization method, according to embodiments.

FIG. 1 is a flowchart of a plasma stabilization method and a deposition method using the plasma stabilization method according to embodiments.

Referring to FIG. 1, in operation S101, a plasma stabilization step is performed in a reactor in a state where no substrate exists. The plasma stabilization step for searching for a plasma matching point may include a step of supplying a source gas (hereinafter, referred to as a "step (a)"), a step of supplying a purge gas (hereinafter, referred to as a "step (b)"), a step of supplying a reactive gas (hereinafter, referred to as a "step (c)"), and a step of supplying plasma (hereinafter, referred to as a "step (d)"). During the plasma stabilization step, the purge gas and the reactive gas may be continuously supplied into a reactor during a period from the step (a) to the step (b). Also, the step (a) through the step (d) may be performed in a state where no substrate exists in the reactor (that is, a substrate is unloaded).

After the plasma stabilization step is performed, in operation S102, a substrate is loaded into the reactor. The substrate may be a substrate of a lot different from that of the substrate that has been previously unloaded or may be a substrate of the same lot as that of the substrate that has been previously unloaded. After the substrate is loaded into the reactor, in operation S103, plasma atomic layer deposition (ALD) is performed on the substrate.

Plasma in a plasma ALD process is an important process parameter. That is, plasma needs to be stably generated in order to form a film having good quality. In a PEALD process, an ignition/extinction cycle of plasma is also short and fast due to fast switching between gases. Accordingly, a matching network has to find a stable plasma matching point during a short time where plasma is ignited. In particular, when plasma matching fails during a time where plasma is ignited at the start of a process, plasma forward power participating in the process is reduced and plasma reflect power is increased in an initial deposition process, thereby leading to process instability.

For example, when substrates are continuously processed, since a deposition atmosphere in a reaction space is maintained, there is no big problem. However, substrates may not be continuously processed in some cases. For example, process of substrates in a cassette such as a front opening unified pod (FOUP) that is designed to hold a plurality of substrates may be completed, deposition may be stopped, and the cassette may be changed to another cassette (that is, another lot). Alternatively, deposition may be stopped in the middle of processing substrates and in-situ cleaning may be performed in order to remove thin films accumulated in a reactor.

When an idle time from when processing of one lot ends to when processing of a next lot starts is lengthened, a deposition atmosphere in a reaction space is changed. Accordingly, when a subsequent substrate (e.g., a first substrate of the next lot) is to be processed, a time taken to find a plasma matching point is lengthened. In this case, thin film deposition is unstable at the start of a deposition process.

In order to solve this problem, according to the present disclosure, a plasma stabilization step is performed in a state where no substrate exists in a reactor (i.e., a substrate is unloaded). Since a substrate is loaded and a deposition step is performed after the plasma stabilization step is performed, plasma instability (e.g., power drop) may be prevented when a thin film is deposited on a substrate. Accordingly, a deposition process may be stably performed from the beginning.

Figure 2:
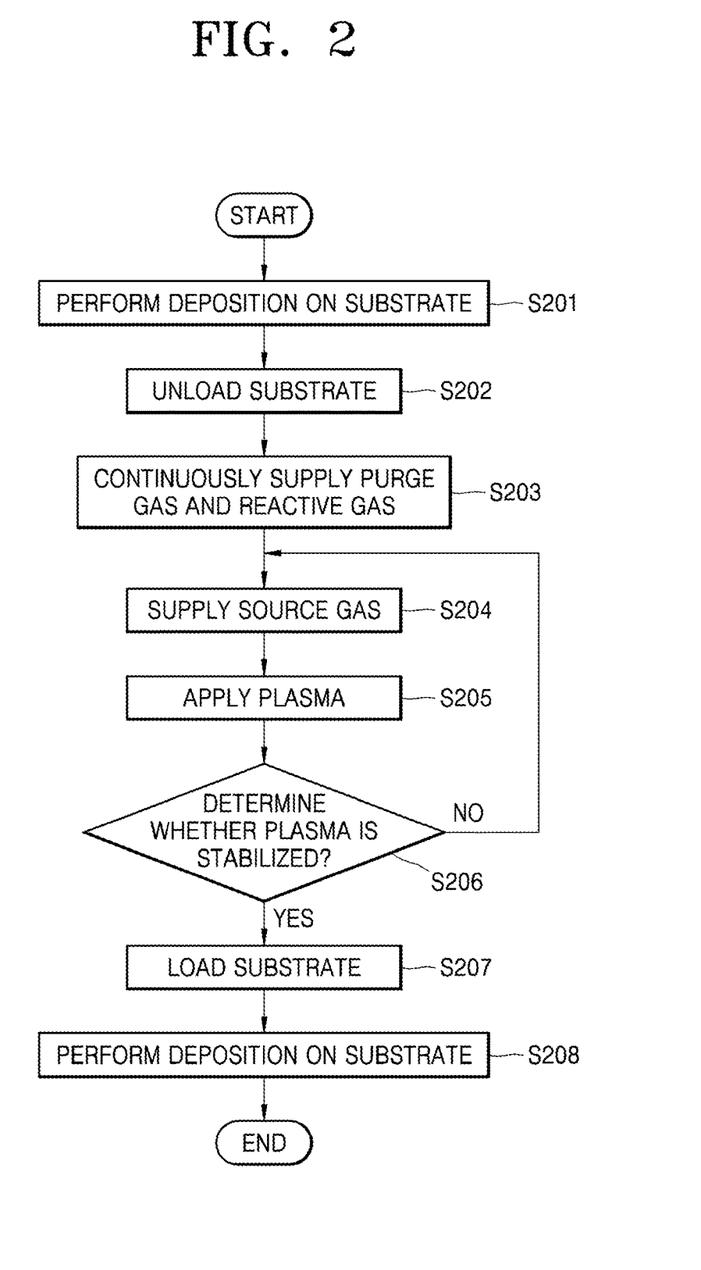
FIG. 2 is a flowchart of a plasma stabilization method and a deposition method using the plasma stabilization method, according to embodiments.

FIG. 2 is a flowchart of a plasma stabilization method and a deposition method using the plasma stabilization method according to embodiments.

Referring to FIG. 2, in operation S201, deposition is performed on a substrate that is loaded into a reactor. Next, the deposition is stopped, and in operation S202, the substrate is unloaded. In a state where the substrate is unloaded and thus no substrate exists, in operation S203, a purge gas and a reactive gas are supplied. The purge gas and the reactive gas may be continuously supplied during the following steps.

The purge gas may be an inert gas such as argon, or may be a relatively stable gas such as nitrogen or oxygen. The reactive gas may be an oxygen gas when an oxide film is to be deposited and may be a nitrogen gas when a nitride film is to be deposited, and a supplied gas may be determined according to a type of a film to be deposited.

Optionally, the purge gas may be used as a reactive gas, and in this case, the purge gas and the reactive gas may be the same type of gas (i.e., a reactive purge gas). The reactive purge gas may be continuously supplied. Accordingly, when plasma is not applied, the reactive purge gas may function as a purge gas, and when plasma is supplied, the reactive purge gas may be activated and may chemically react with a source gas chemically adsorbed onto the substrate to be used as an element for forming a deposited thin film.

For example, the reactive purge gas may be an oxygen gas or a nitrogen gas. The oxygen gas or the nitrogen gas may function as a purge gas before plasma is supplied because the oxygen gas or the nitrogen gas has no reactivity with a source gas. The oxygen gas or the nitrogen gas may be activated and may react with a source gas to form an oxide film or a nitride film when plasma is supplied.

After (or when) the purge gas and the reactive gas are supplied, in operation S204, a source gas is supplied. When a silicon-based film is to be formed, the source gas may include at least one of materials including silicon, for example, silane materials such as monosilane, disilane, dichlorosilane (DCS), and aminosilane (e.g., bisdiethylaminosilane (BDEAS) or diisopropylaminosilane (DIPAS)). The source gas may be adsorbed onto a wall of the reactor or a susceptor.

Next, in operation S205, plasma is supplied into the reactor. The reactive gas (or the source gas) may be activated by plasma. The plasma may be in-situ plasma that is directly generated on the substrate in a reaction space or remote plasma that is generated outside the reactor and is supplied into the reaction space. Power of the plasma may be equal to or less than power of plasma supplied during a film deposition process.

Due to the activation by the plasma, the source gas and the reactive gas adsorbed onto the reactor wall may react to form a thin film. Also, since the substrate is unloaded and thus there is no substrate, the source gas and the reactive gas adsorbed onto the susceptor may react to form a thin film on the susceptor.

Next, in operation S206, it is determined whether the plasma is stabilized. Whether the plasma is stabilized may be determined based on the number of times the above steps are repeatedly performed. Alternatively, whether the plasma is stabilized may be determined by using a separate apparatus (e.g., an apparatus for measuring forward power of the plasma).

When it is determined in operation S206 that the plasma is not stabilized, operation S204 in which the source gas is supplied and operation S205 in which the plasma is applied may be performed again. While operations S204 and S205 are performed, the purge gas and the reactive gas may be continuously supplied.

When it is determined in operation S206 that the plasma is stabilized, operations S203 through S206 end, and in operation S207, a new substrate is loaded. In operation S208, deposition is performed on the loaded substrate.

As described above, since an environment suitable for a plasma matching condition is formed by alternately supplying a source gas, a reactive gas, and plasma in a reaction space before a substrate is loaded into the reactive space, when the substrate is loaded later and a process starts, a plasma power drop is prevented and a deposition process is stably performed from the start of the process.

Figure 3:
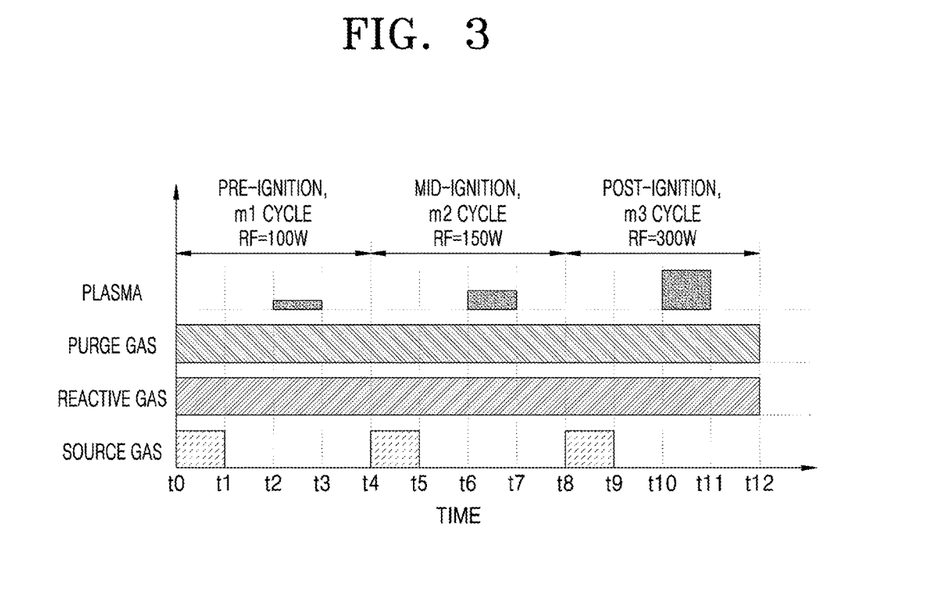
FIG. 3 is a timing diagram for explaining a plasma stabilization step according to embodiments.

FIG. 3 is a timing diagram for explaining a plasma stabilization step according to embodiments.

Referring to FIG. 3, the afore-described plasma stabilization method may be performed in a plurality of cycles. In more detail, a plurality of cycles may be performed when a step of supplying a source gas, a step of supplying a purge gas, a step of supplying a reactive gas, and a step of supplying plasma are referred to as one cycle.

The plurality of cycles may include at least one from among a pre-ignition cycle, a mid-ignition cycle, and a post-ignition cycle. Although three cycles are all performed in the present embodiment, the present disclosure is not limited thereto and only some of the three cycles may be performed.

First, in a pre-ignition cycle, a source gas is supplied during a period from a time t0 to a time t1. A reactive gas and a purge gas are continuously supplied into a reactor during a period from a time t0 to a time t4 (and after the time t4).

The source gas is supplied, and the supplying of the source gas is stopped at the time t1. Next, plasma is applied (supplied) at a time t2, and the applying (supplying) of the plasma is stopped at a time t3. A thin film may be deposited on an inner wall of the reactor or a susceptor because of the above process.

Power of the applied plasma may be less than power of plasma during a normal deposition process. Power of the plasma supplied during the pre-ignition cycle may be about ⅓ of power of plasma during the normal deposition process. For example, when power of plasma supplied during the normal deposition process is 300 W, power of the plasma supplied during the pre-ignition cycle may be 100 W. The period from the time t0 to t4 may be repeated several times (i.e., m1 times). For example, the pre-ignition cycle may be repeatedly performed about three to five times.

After the pre-ignition cycle, a mid-ignition cycle may be performed. In more detail, the source gas is supplied during a period from a time t4 to a time t5 of the mid-ignition cycle and the reactive gas and the purge gas are continuously supplied during a period from a time t4 to a time t8. Next, the plasma is supplied during a period from a time t6 to a time t7, and the reactive gas is activated and reacts with the source gas to form a thin film on a wall of the reactor.

Power of the plasma applied during the mid-ignition cycle may be greater than power of the plasma applied during the pre-ignition cycle, and may be less than power of plasma during the normal deposition process. Power of the plasma applied during the mid-ignition cycle may be about ½ of power of plasma during the normal deposition process. For example, when power of plasma supplied during the normal deposition process is 300 W, power of the plasma applied during the mid-ignition cycle may be 150 W. The period from a time t4 to the time t8 may be repeated several times (i.e., m2 times). For example, the mid-ignition cycle may be repeatedly performed three to five times.

After the mid-ignition cycle, a post-ignition cycle may be performed. In more detail, the source gas is supplied during a period from a time t8 to a time t9 of the post-ignition cycle, and the reactive gas and the purge gas are continuously supplied during a period from a time t8 to a time t12. Next, the plasma is supplied during a period from a time t10 to a time t11, and thus the reactive gas is activated and reacts with the source gas to form a thin film on a wall of the reactor.

Power of the plasma applied during the post-ignition cycle may be greater than power of the plasma applied during the mid-ignition cycle, and may be equal to or less than power of plasma during the normal deposition process. Power of the plasma applied during the post-ignition cycle may be equal to power of plasma during the normal deposition process. For example, when power of plasma supplied during the normal deposition process is 300 W, power of the plasma applied during the post-ignition cycle may be 300 W. The period from a time t8 to the time t12 may be repeated several times (i.e., m3 times). For example, the post-ignition cycle may be repeatedly performed three to five times.

Although the pre-ignition cycle, the mid-ignition cycle, and the post-ignition cycle are each performed only one time in FIG. 3, the present disclosure is not limited thereto. For example, as described above, each of the pre-ignition cycle, the mid-ignition cycle, and the post-ignition cycle may be performed three to five times. Also, although levels of power of plasma supplied during the pre-ignition cycle, the mid-ignition cycle, and the post-ignition cycle are respectively ⅓, ½, and 1 time a level of power of plasma supplied during the deposition process in the above, the present disclosure is not limited thereto and levels of power of plasma supplied during the cycles may be adjusted to increase sequentially (furthermore, stepwise) in a range from 10% to 100% of a level of power of plasma supplied during the deposition process.

Figure 4:
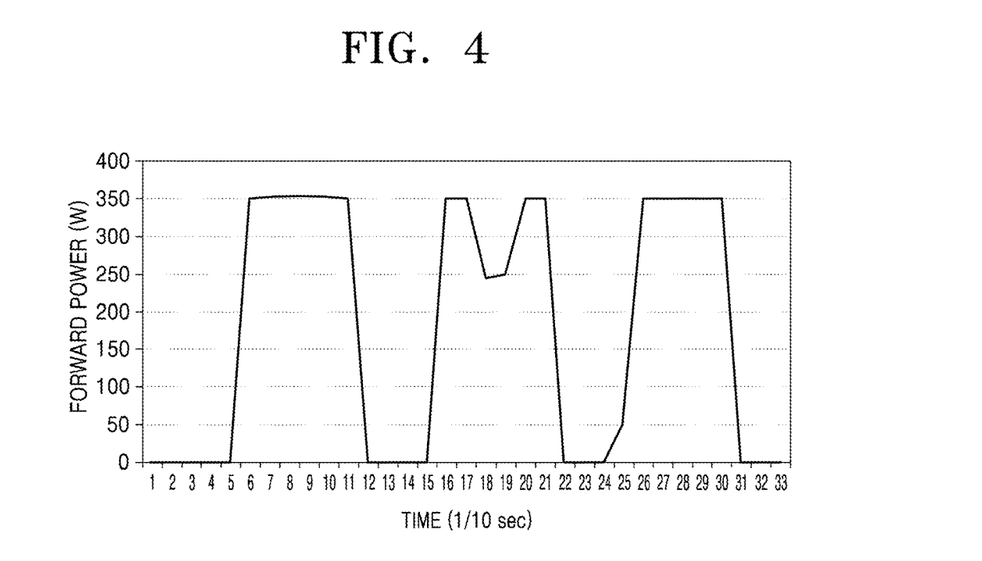
FIG. 4 is a graph illustrating a case where plasma is unstably generated when deposition is performed on a first substrate by performing a process after a long idle time.

FIG. 4 is a graph illustrating a case where plasma is unstably generated when deposition is performed on a substrate by performing a process after a long idle time. Referring to FIG. 4, forward power of plasma generated by a plasma generator is not maintained at a constant level and is reduced not long after a process starts.

Such a power drop occurs because plasma matching fails during a time where plasma is ignited when the process starts on a substrate in a reaction space after a long idle time of a reactor. As a plasma matching time increases, forward power decreases and reflect power increases. Accordingly, power of plasma participating in an actual reaction is reduced, the quality of a thin film that is deposited is degraded, and thus a first wafer may have to be thrown away.

According to embodiments, an appropriate atmosphere for a plasma process in a reaction space is formed by repeatedly performing ignition cycles before a normal deposition. Accordingly, when a first substrate is loaded into a reaction space and a process is performed after an idle time (e.g., because a lot with substrates is to be changed or in-situ cleaning of a reactor is to be performed), the process may be stably performed in a stable plasma atmosphere beginning from a first substrate.

Figure 5:
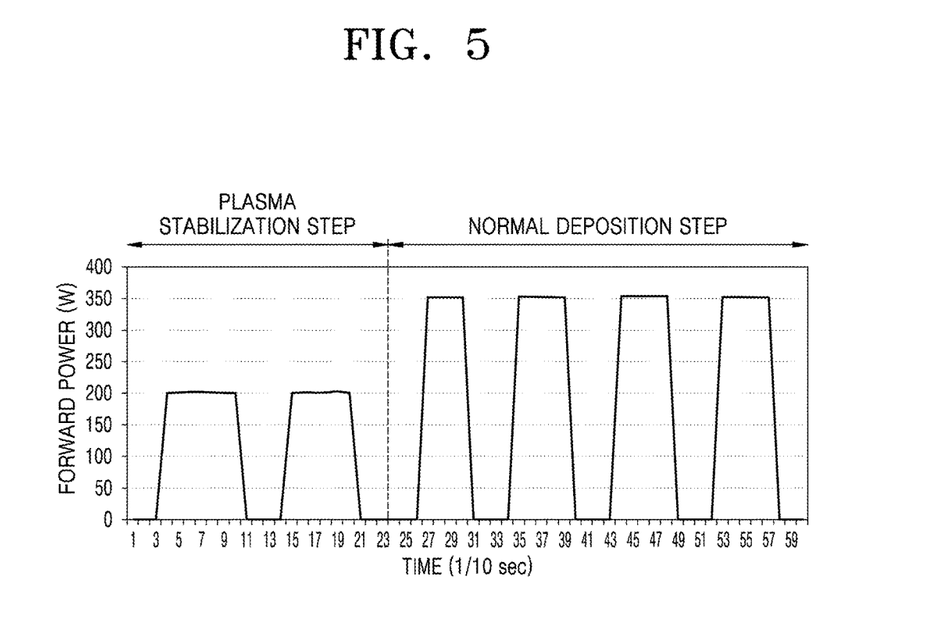
FIG. 5 is a graph illustrating a case where plasma supplied into a reactor is stabilized when a normal deposition step is performed by loading a substrate after a plasma stabilization step is performed, according to an embodiment.

FIG. 5 is a graph illustrating a case where plasma supplied into a reaction space is stabilized when a normal deposition step is performed by loading a substrate after a plasma stabilization step is performed according to an embodiment.

Referring to FIG. 5, a plasma stabilization step is performed. During the plasma stabilization step, plasma with power of 200 W that is about 57.15% of 350 W that is power of plasma during an actual deposition process may be supplied. Since the plasma stabilization step is performed, a power drop as shown in FIG. 4 does not occur during a normal deposition step. In other words, a chamber atmosphere for a stable plasma matching condition may be set in a reaction space before a substrate is loaded owing to the plasma stabilization step. Accordingly, after the substrate is loaded, a stable plasma process may be performed from the start of a process.

Figure 6:
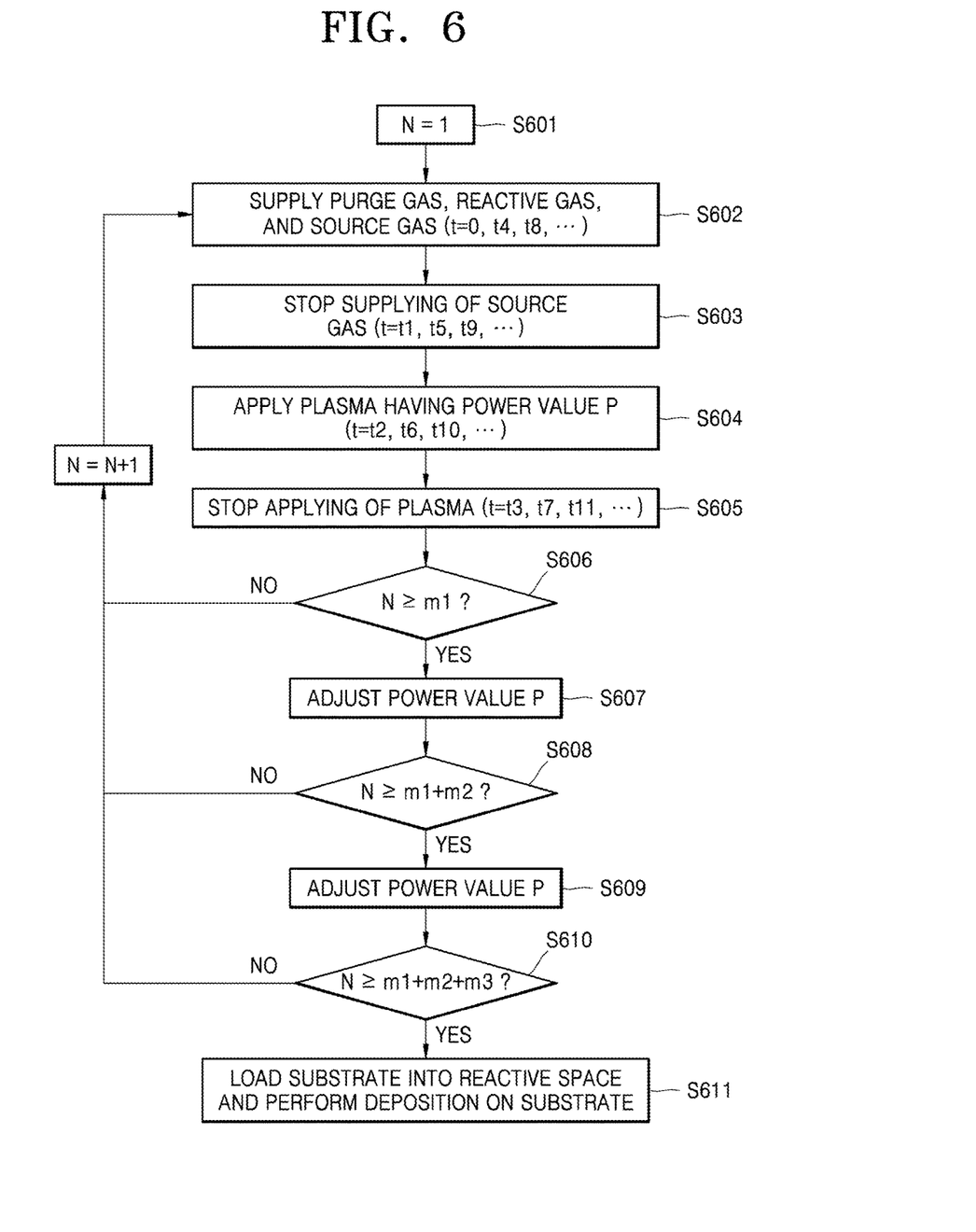
FIG. 6 is a flowchart of a plasma stabilization method and a deposition method using the plasma stabilization method, according to embodiments.

FIG. 6 is a flowchart of a plasma stabilization method and a deposition method using the plasma stabilization method according to embodiments.

Referring to FIG. 6, in operation S601, N=1 is set. In operation S602, a first step of supplying a purge gas, a reactive gas, and a source gas into a reactor is performed. In an optional embodiment, during the first step, a reactive purge gas and the source gas may be supplied into the reactor.

In operation S603, a second step of stopping the supplying of the source gas is performed. During the second step, the supplying of the purge gas and the reactive gas may be continuously performed. In an optional embodiment, in the second step, the supplying of the source gas may be stopped and the supplying of the reactive purge gas may be continuously performed.

When a predetermined time passes after the second step, in operation S604, a third step of applying plasma with a power value P is performed. In an optional embodiment, in the third step, the supplying of the reactive purge gas may be continuously performed so that the reactive purge gas is activated by plasma and chemically reacts with the source gas supplied and adsorbed onto a susceptor or an inner wall of the reactor to form a thin film. As described above, the plasma may be applied or supplied by using an in-situ method or a remote method. After the third step, in operation S605, a fourth step of stopping the applying of the plasma is performed.

Like in the above embodiments, the first through fourth steps may be referred to as one cycle and may be repeatedly performed a plurality of times. That is, a plurality of cycles may be performed with the first through fourth steps as one cycle. Also, a plurality of cycles may include a pre-ignition cycle, a mid-ignition cycle, and/or a post-ignition cycle as described above, and levels of power of plasma supplied during the cycles may be different from one another.

First, in operation S606, the pre-ignition cycle may be performed m1 times and it is determined whether the pre-ignition cycle is performed m1 times. When N<m1, a value N is increased and the first through fourth steps of the pre-ignition cycle are repeatedly performed. When N≥m1, in operation S607, the power value P is adjusted (e.g., reduced, maintained, or increased) in order to perform the mid-ignition cycle, and the first through fourth steps of the mid-ignition cycle are performed.

Next, in operation S608, it is determined whether N≥m1+m2 in order to determine whether the mid-ignition cycle is performed m2 times. When N<m1+m2, the value N is increased and the first through fourth steps of the mid-ignition cycle are repeatedly performed. When N≥m1+m2, in operation S609, the power value P is adjusted (e.g., reduced, maintained, or increased) in order to perform the post-ignition cycle and the first through fourth steps of the post-ignition cycle are performed.

Next, in operation S610, it is determined whether N≥m1+m2+m3 in order to determine whether the post-ignition cycle is performed m3 times. When N<m1+m2+m3, the value N is increased and the first through fourth steps of the post-ignition cycle are repeatedly performed. When N≥m1+m2+m3, it means that the post-ignition cycle ends. Accordingly, in operation S611, a fifth step of loading a substrate into a reactive space and performing deposition on the substrate is performed.

As described above, during the second step of stopping the supplying of the source gas S603 and the third step of applying the plasma S604, the purge gas and the reactive gas (or the reactive purge gas) may be continuously supplied. Also, during the fourth step of stopping the applying of the plasma S605 and the fifth step of performing deposition on the substrate S611, the purge gas and the reactive gas (or the reactive purge gas) may be continuously supplied.

Figure 7:
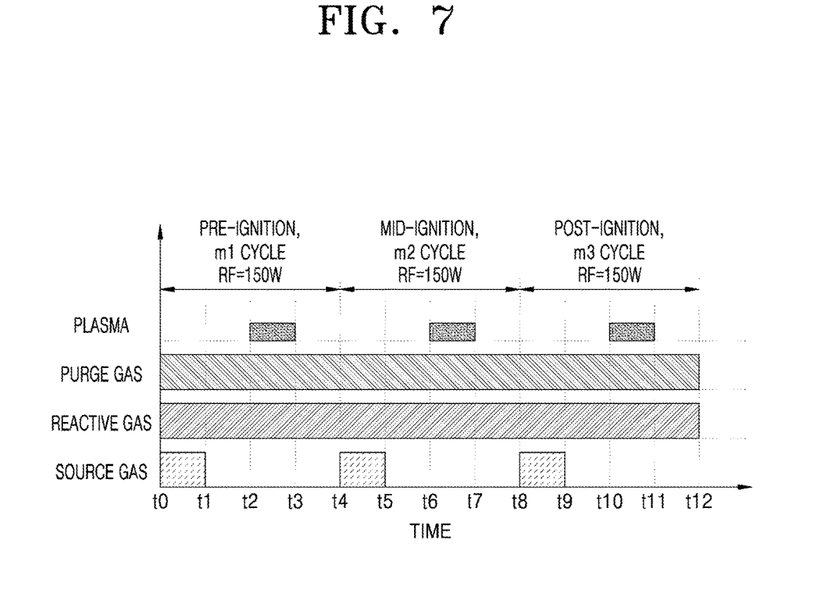
FIG. 7 is a timing diagram for explaining a process of stabilizing plasma in a reactor before a deposition process, according to another embodiment.

FIG. 7 is a timing diagram for explaining a process of stabilizing plasma in a reactor before a deposition process according to another embodiment. Referring to FIG. 7, during a plasma stabilization step, plasma with power of 150 W that is about 50% of 300 W that is power of plasma during an actual deposition process may be constantly supplied. In other words, a plurality of cycles may be performed, a step of supplying a source gas, a step of supplying a purge gas, a step of supplying a reactive gas, and a step of supplying plasma are referred to as one cycle, and levels of plasma power supplied during the cycles may be the same and may be less than a level of plasma power supplied during a substrate deposition process. However, the present disclosure is not limited thereto, and levels of power of plasma applied in ignition steps may be maintained constant or increase or decrease stepwise in a range from 10% to 100% of a level of plasma power during an actual deposition process.

Figure 8:
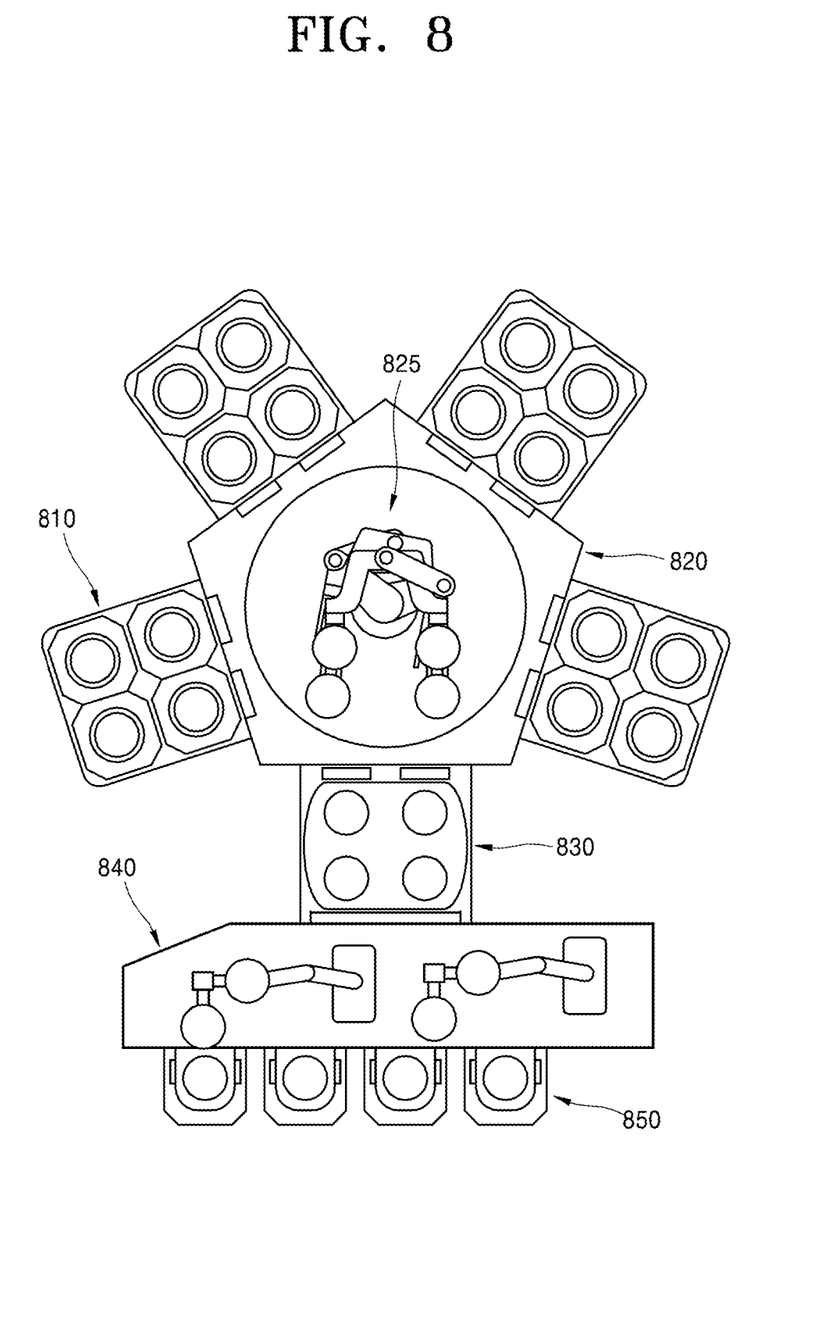
FIG. 8 is a view of a substrate processing apparatus according to an embodiment.

FIG. 8 is a view of a substrate processing apparatus according to an embodiment. The substrate processing apparatus may include a reaction chamber 810, a transfer chamber 820, a load-lock 830, a transfer device 840 such as an equipment front end module, and a (wafer) carrier 850 such as a front opening unified pod (FOUP).

A process of supplying a source gas and a reactive gas onto a substrate to deposit a thin film may be performed in the reaction chamber 810. Also, deposition, etching, and substantial processing of substrates may be performed in the reaction chamber 810. The transfer chamber 820 may include a transfer robot 825 that transfers the substrate between the load-lock 830 and the reaction chamber 810. The load-lock 830 may be configured to hold substrates to be loaded into the reaction chamber 810 or cool substrates that have been completely processed in the reaction chamber 810. The reaction chamber 810, the transfer chamber 820, and the load-lock 830 may be maintained in a vacuum state. Alternatively, since a pressure in the transfer chamber 820 is higher than that in the reaction chamber 810 and lower than an external atmospheric pressure, the source gas or the reactive gas in the reaction chamber 810 may be prevented from flowing backward to the transfer chamber 820 and contaminating the transfer chamber 820.

The transfer device 840 such as an EFEM may be maintained in an atmospheric pressure state, and may include a robot arm. The robot arm may be configured to remove a substrate from the carrier 850 such as an FOUP and transfer the substrate to the load-lock 830, or to remove the substrate from the load-lock 830 and transfer the substrate to an original position in the carrier 850.

The carrier 850 that is a container for holding a substrate before or after being processed may be configured to receive, for example, 25 substrates. For commercial production, a process is performed in units of one carrier 850, for example, in units of 25 substrates, which is referred to as a lot. Accordingly, when one lot is processed, 25 substrates in one carrier 850 (e.g., an FOUP) are processed. The carrier 850 may be transferred, and is transferred by an automatic processing system in a fabrication plant to substrate processing devices such as deposition equipment, etching equipment, and photolithography equipment in accordance with a process order.

When a first deposition process is performed on a plurality of first set of substrates (e.g., a first lot) and then a second deposition step is performed on a plurality of new second set of substrates (e.g., a second lot), a plasma stabilization step according to embodiments of the present invention may be performed between the first deposition step and the second deposition step. That is, the plasma stabilization step may be performed during an idle time between deposition on a last substrate from among the first set of substrates and deposition on a first substrate from among the second set of substrates.

As described above, when deposition on a substrate is made by performing a process after an idle time, unstable plasma may be generated. In order to solve this problem, according to the present disclosure, the plasma stabilization step is performed until deposition on the second lot starts after deposition on the first lot ends. As a result, an appropriate atmosphere for a plasma process may be formed in a reactive space and stable deposition may be performed beginning from the first substrate.

In an optional embodiment, the plasma stabilization step may be performed during at least one period from among a first period during which a substrate is transferred from the carrier 850 to the transfer device 840, a second period during which the substrate is transferred from the transfer device 840 to the load-lock 830, a third period during which the substrate is transferred from the load-lock 830 to the transfer chamber 820, and a fourth period during which the substrate is transferred from the transfer chamber 820 to the reaction chamber 810.

Figure 9:
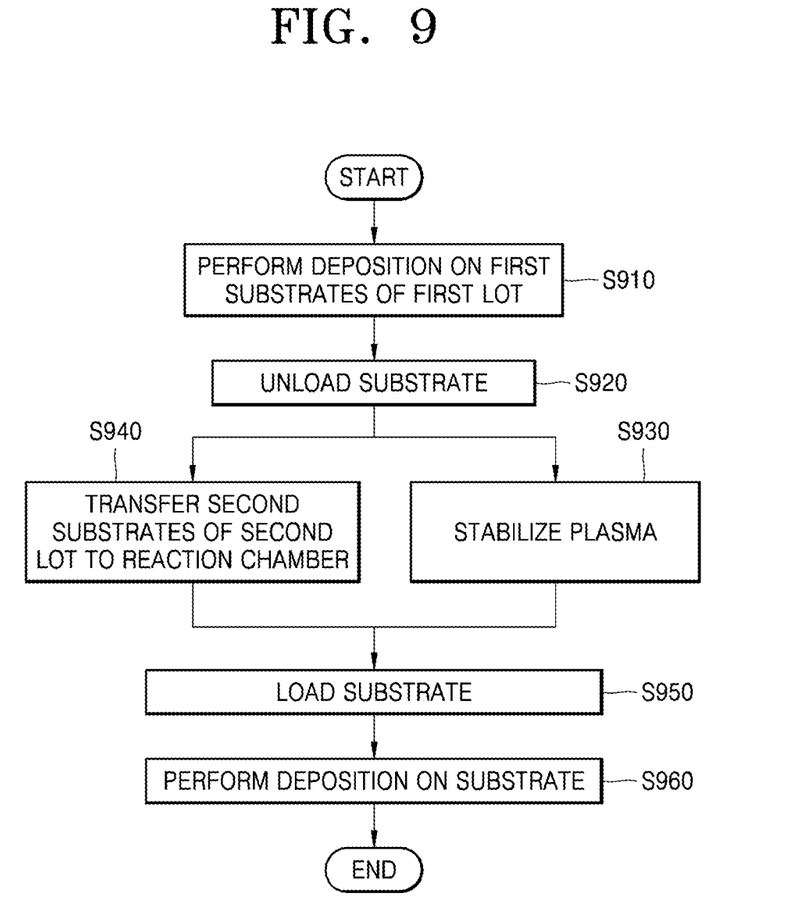
FIGS. 9 and 10 are flowcharts of a plasma stabilization step and a deposition method, according to embodiments.

This embodiment is illustrated in FIG. 9 in more detail. Referring to FIG. 9, first, in operation S910, deposition on first substrates of a first lot is performed. In operation S920, a substrate is unloaded when a task on the first lot ends. In operation S930, plasma stabilization is performed on unloaded deposition equipment. At the same time, in operation S940, second substrates of a second lot are transferred into a reaction chamber. That is, a plasma stabilization step may be performed during an idle time where the second substrates of the second lot are transferred to the reaction chamber. In operation S950, a substrate is loaded. In operation S960, deposition is performed on the loaded substrate.

Since plasma stabilization is performed when the substrate is being transferred to the reaction chamber (i.e., when the substrate is being transferred from a carrier to a transfer device, from the transfer device to a load-lock, and from the load-lock through a transfer chamber to a reaction space), the plasma stabilization may not substantially affect productivity per time. In an optional embodiment, during a plasma stabilization process according to an embodiment, the substrate may be located on a robot arm in the transfer chamber and may wait in front of the reaction space.

In another optional embodiment, the plasma stabilization step may be performed after in-situ cleaning is performed in order to remove a thin film formed on an inner wall of the reaction chamber (e.g., a reactor).

Figure 10:
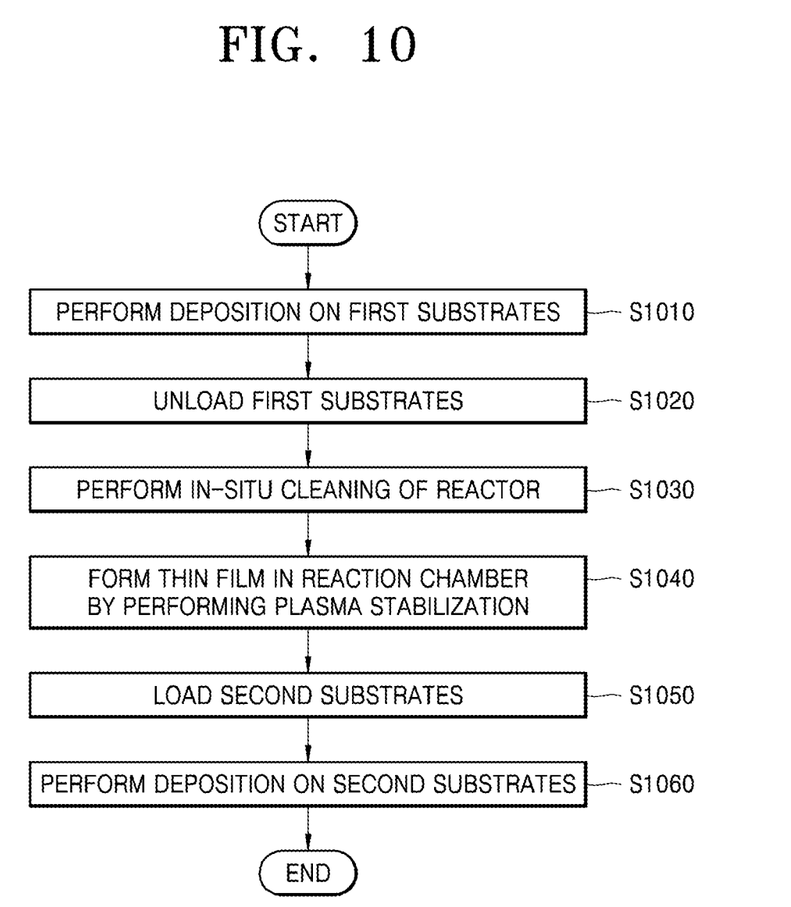

This embodiment is illustrated in FIG. 10 in more detail. Referring to FIG. 10, in operation S1010, deposition on first set of substrates is performed. In operation S1020, the first set of substrates is unloaded when a task on the first set of substrates ends. Next, in operation S1030, in-situ cleaning of unloaded deposition equipment is performed. The in-situ cleaning may be performed in order to remove a thin film deposited in a reaction space in the deposition equipment as a deposition process is continuously performed as described.

After the in-situ cleaning, in operation S1040, a thin film is formed in a reaction chamber by performing plasma stabilization. Next, in operation S1050, a plurality of second substrates are loaded. In operation S1060, deposition on the second set of substrates is performed. In other words, the plasma stabilization may be performed during an idle time between deposition on a last substrate from among the first set of substrates and deposition on a first substrate from among the second set of substrates. Also, the first set of substrates and the second set of substrates may be included in the same lot or different lots.

Figure 11:
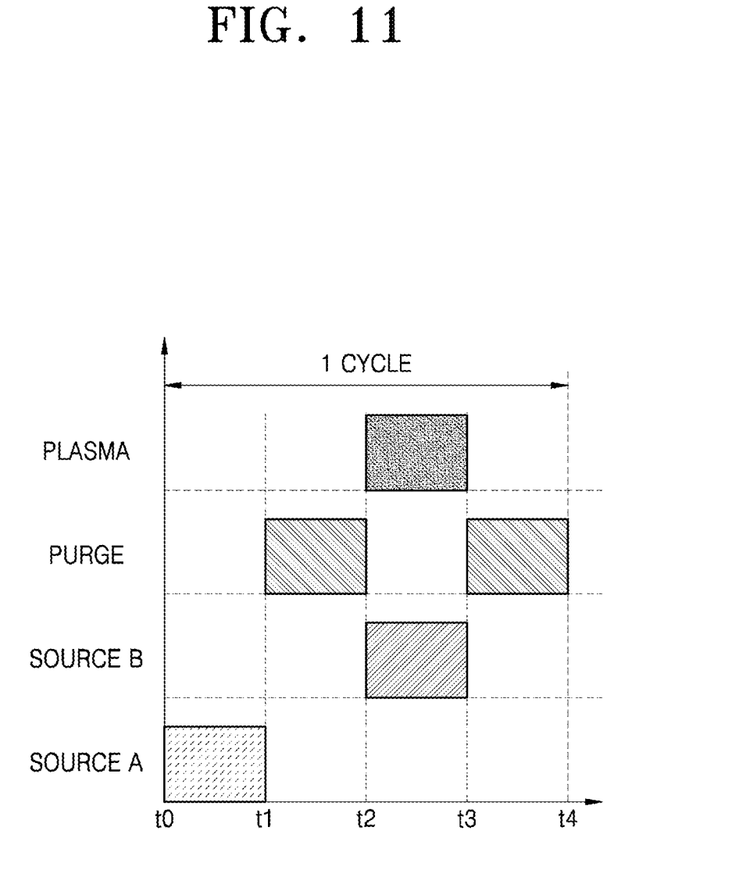
FIG. 11 is a timing diagram for explaining an atomic layer deposition (ALD) process performed after a plasma stabilization method, according to embodiments.

FIG. 11 is a timing diagram for explaining an ALD process performed after a plasma stabilization method according to embodiments.

Referring to FIG. 11, for plasma ALD, at least two types of gases and plasma are supplied into a reactive space. The gases and the plasma may be supplied as pulses and/or alternately. Also, at least some of the gases may be continuously supplied during the deposition process.

For example, during a period from a time t0 to a time t1, a first gas is supplied into the reaction space and is chemisorbed onto a substrate. Next, during a period from a time t1 to a time t2, the supplying of the first gas is stopped and a purge gas is supplied into the reaction space to discharge the first gas remaining in the reaction space to the outside of a reactor. During a period from a time t2 to a time t3, a second gas is supplied into the reaction space and chemically reacts with the first gas that is chemisorbed onto the substrate to form a thin film layer.

During the period from a time t2 to the time t3, plasma is supplied so that the thin film layer is formed at a low temperature (i.e., so that a chemical reaction occurs at a low temperature). Next, during a period from a time t3 to a time t4, the supplying of the second gas is stopped and the purge gas is supplied again to remove the second gas that remains from the reactor. Although the plasma is supplied (applied) when the second gas is supplied in FIG. 11, the plasma may be supplied (applied) when the first gas is supplied.

One process of forming such a unit thin film is defined as a cycle. That is, a period from the time t0 to the time t4 in FIG. 11 may be defined as one cycle, and a thin film having a desired thickness may be formed by repeatedly performing the cycle a plurality of times.

In an optional embodiment, a plasma stabilization step may be performed by using the ALD process of FIG. 11. That is, in a state where a substrate is unloaded, deposition on a first substrate after an idle time may be stably performed by performing the ALD process of FIG. 11. In other words, before a deposition step is performed, stable deposition on a substrate may be performed by searching for a plasma matching point by supplying a source gas, a reactive gas, and plasma under a condition similar to that of a deposition step.

The condition similar to that of the deposition step may include a condition that the first gas used in the deposition step should include the source gas supplied during the plasma stabilization step or should be the same gas as the source gas. Also, the condition may include a condition that the second gas used in the deposition step should include the reactive gas supplied during the plasma stabilization step or should be the same gas as the reactive gas.

Also, not only types of gases supplied during the plasma stabilization step and the deposition step, but also other parameters during both steps may also be the same. For example, flow rates of the source gas, the purge gas, and the reactive gas supplied during the plasma stabilization step may be the same as flow rates of the source gas, the purge gas, and the reactive gas supplied during the film deposition process.

In contrast, the plasma supplied during the plasma stabilization step may have a power value less than that of the plasma supplied during the deposition step, and may be set to increase stepwise as described. As such, an atmosphere may be smoothly formed in the reaction space and plasma matching may be achieved by adjusting plasma power.

Embodiments should not be construed as limited to the particular shapes of portions illustrated herein for better understanding of the present disclosure but may be to include deviations in shapes.

While one or more embodiments have been described with reference to the figures, it will be understood by one of ordinary skill in the art that various changes in form and details may be made therein without departing from the spirit and scope of the disclosure as defined by the following claims.

What is claimed is:
1. A deposition method comprising:
    performing a first deposition process on a plurality of first set of substrates; and
    performing a second deposition process on a plurality of second set of substrates,
    wherein plasma stabilization is performed between the first and second deposition processes, and wherein the plasma stabilization comprises:
        (a) supplying a source gas;
        (b) supplying a purge gas;
        (c) supplying a reactive gas; and
        (d) supplying plasma, wherein the purge gas and the reactive gas are continuously supplied into a reactor during (a) through (d), and wherein the plasma stabilization method is performed in a state where no substrate exists in the reactor.

2. The deposition method of claim 1, wherein, when (a) through (d) are referred to as one cycle, a plurality of cycles are performed and wherein levels of power of the plasma supplied during the plurality of cycles are different from one another.

3. The deposition method of claim 2, wherein the levels of plasma power supplied during the plurality of cycles increase sequentially in a range from about 10% to about 100% of a level of plasma power supplied during a film deposition process on a substrate.

4. The deposition method of claim 3, wherein the levels of plasma power increase stepwise.

5. The deposition method of claim 3, wherein the plurality of cycles include a pre-ignition cycle, a mid-ignition cycle, or a post-ignition cycle.

6. The deposition method of claim 5, wherein the levels of plasma power supplied during the pre-ignition cycle, the mid-ignition cycle, and the post-ignition cycle are respectively ⅓, ½, and 1 time the level of plasma power supplied during a film deposition process on a substrate.

7. The deposition method of claim 5, wherein each of the pre-ignition cycle, the mid-ignition cycle, and the post-ignition cycle is repeatedly performed three to five times.

8. The deposition method of claim 1, wherein, when (a) through (d) are referred to as one cycle, a plurality of cycles are performed and wherein levels of power of the plasma supplied during the plurality of cycles are the same and are less than a level of plasma power supplied during a film deposition process on a substrate.

9. The deposition method of claim 1, wherein flow rates of the source gas, the purge gas, and the reactive gas are the same as flow rates of a source gas, a purge gas, and a reactive gas supplied during a film deposition process on a substrate.

10. The deposition method of claim 1, wherein a thin film is formed on an inner wall of the reactor during (a) through (d).

11. The deposition method of claim 1, wherein the reactive gas and the purge gas are the same type of reactive purge gas, and
wherein the reactive purge gas does not react with the source gas when the reactive purge gas is not activated by plasma and reacts with the source gas when the reactive purge gas is activated by plasma.

12. The deposition method of claim 1, further comprising: loading a substrate into the reactor.

13. A deposition method comprising:
performing a first deposition process on a plurality of first set of substrates; and
performing a second deposition process on a plurality of second set of substrates,
wherein plasma stabilization is performed between the first and second deposition processes, and wherein the plasma stabilization comprises:
supplying a purge gas, a reactive gas, and a source gas;
first stopping the supplying of the source gas, after the supplying;
applying plasma, after the first stopping; and
second stopping the applying of the plasma, after the applying,
wherein the second deposition process comprises loading a substrate into a reactor and performing deposition on the substrate, after the second stopping.

14. The deposition method of claim 13, wherein each of the first deposition process, the plasma stabilization process and the second deposition process is cyclically repeated.

15. A deposition method comprising:
performing a first deposition process on a plurality of first set of substrates;
performing a second deposition process on a plurality of second set of substrates,
wherein plasma stabilization is performed between the first and second deposition processes,
wherein a purge gas and a reactive gas are supplied during the plasma stabilization, and wherein supplying of a source gas and supplying of plasma are alternately performed.

16. The deposition method of claim 15, wherein the plasma stabilization is performed during at least one period from among a first period during which a substrate is transferred from a carrier to a transfer device, a second period during which the substrate is transferred from the transfer device to a load-lock device, a third period during which the substrate is transferred from the load-lock device to a transfer chamber, and a fourth period during which the substrate is transferred from the transfer chamber to a reaction chamber.

17. The deposition method of claim 15, wherein the plasma stabilization is performed during an idle time between deposition on a last substrate from among the plurality of first set of substrates and deposition on a first substrate from among the plurality of second set of substrates.

18. The deposition method of claim 17, wherein the plurality of first set of substrates are included in a first lot, and wherein the plurality of second set of substrates are included in a second lot that is different from the first lot.

19. The deposition method of claim 17, wherein the plasma stabilization is performed after in-situ cleaning of a reaction chamber is performed.

20. The deposition method of claim 15, wherein at least one of the first and second deposition processes comprises:
supplying a first gas;
removing the first gas that remains with the use of a purge gas;
supplying a second gas and plasma; and
removing the second gas that remains with the use of the purge gas,
wherein the first gas comprises the source gas supplied during the plasma stabilization, and
wherein the second gas comprises the reactive gas supplied during the plasma stabilization.

* * * * *